(12) United States Patent
Wu

(10) Patent No.: US 6,200,850 B1
(45) Date of Patent: Mar. 13, 2001

(54) METHOD FOR FORMING A STACKED CAPACITOR

(75) Inventor: Tsung-Chih Wu, Hsinchu Hsien (TW)

(73) Assignees: United Microelectronics Corp.; United Semiconductor Corp., both of Hsinchu (TW)

(*) Notice: Subject to any disclaimer, the term of this patent is extended or adjusted under 35 U.S.C. 154(b) by 0 days.

(21) Appl. No.: 09/451,425

(22) Filed: Nov. 30, 1999

(51) Int. Cl.[7] .............................. H01L 21/8242
(52) U.S. Cl. ............................ 438/241; 438/253
(58) Field of Search .................... 438/210, 241, 438/253, 396, 595

(56) References Cited

U.S. PATENT DOCUMENTS 5,612,241 * 3/1997 Arima .................................. 438/241
5,955,758 * 9/1999 Sandhu et al. ...................... 438/253
6,008,084 * 12/1999 Sung .................................... 438/241

\* cited by examiner

*Primary Examiner*—Chandra Chaudhari
(74) *Attorney, Agent, or Firm*—Jiawei Huang; J C Patents

(57) ABSTRACT

A method for forming a stacked capacitor. A gate is formed on a provided substrate. Doped regions are formed in the substrate beside the gate. A first dielectric layer is formed over the substrate. A part of the first dielectric layer is removed to form a node contact opening and a bit line contact opening. The bit line contact opening is located between the gate and separates the gate into two portions. Spacers are formed on sidewalls of the node contact openings and on the bit line contact opening. Conductive material is formed to fill the openings to form a bit line and a landing pad. A second dielectric layer having a opening exposing the landing pad is formed on the first dielectric layer. Conductive material is formed to fill the opening to form a lower electrode. A dielectric film and a upper are formed on the lower electrode.

13 Claims, 4 Drawing Sheets

METHOD FOR FORMING A STACKED CAPACITOR

BACKGROUND OF THE INVENTION

1. Field of the Invention

The invention relates in general to a method of manufacturing dynamic random access memory (DRAM), and more particularly to a method for forming a stacked DRAM capacitor.

2. Description of the Related Art

As semiconductor manufacturing advances into the deep submicron range, dimensions of devices shrink considerably. Due to a shorter circuit path, the performance level of an integrated circuit is raised. In general, for the same circuit layout of semiconductor devices, operating speed is related to device density. As density of device increases, space allocated for the construction of DRAM capacitor is reduced. In other words, dimensions of each DRAM capacitor and hence the maximum quantity of electric charges stored inside each capacitor are reduced. Consequently, frequent recharging of the DRAM capacitor is necessary and data processing speed of the DRAM unit is lowered.

Many capacitor structures are developed for increasing surface area of a lower electrode to increase capacitance. In a conventional process of manufacturing a DRAM capacitor, a bit line is formed within a first dielectric layer over a substrate. A second dielectric is formed on the first dielectric layer. An opening is formed through the second dielectric layer and the first dielectric layer to expose a part of the substrate. A conductive material is formed into the opening to form a lower electrode. FIGS. 1A–1E are schematic, cross-sectional views showing a conventional method for forming the lower electrode.

Referring to FIG. 1A, a substrate 100 having a field oxide 102 is provided. A gate oxide layer 104 is formed on the substrate 100. A polysilicon layer 106 is formed on the gate oxide layer 104. A cap layer 108 is formed on the polysilicon layer 106 to protect the polysilicon layer 106.

In FIG. 1B, the cap layer 108, the polysilicon layer 106 and the gate oxide layer 104 are defined to form a gate structure. The gate structure comprises the gate oxide layer 104a, the polysilicon layer 106a and the cap layer 108a. An ion implantation process is performed to form doped regions 110 within the substrate 100 beside the gate structure.

In FIG. 1C, a thin buffer oxide layer 112 is formed over the structure shown in FIG. 1B. A silicon nitride spacer 114 is formed on the sidewall of the gate structure. A planarized dielectric layer 116 is formed over the whole substrate 100. The buffer oxide layer 112 is used to release stress from the silicon nitride spacer 114.

In FIG. 1D, a part of dielectric layer 116 is etched to form a bit line contact opening 118. Conductive material is formed on the dielectric layer 116 and fills the contact opening 118. The conductive material is defined to form a bit line 120 electrically connecting to the substrate 100.

In FIG. 1E, a planarized dielectric layer 122 is formed over the structure shown in FIG. 1D. A photolithography and etching process is performed to form a node contact opening 124 exposing a part of the doped region 110. Conductive material 126 is formed to fill the node contact opening 124 and then defined to form a lower electrode of a capacitor.

The conventional method for forming a lower electrode has several disadvantages. One is that the conductive material serving as the bit line 120 may make contact with the polysilicon layer 106a of the gate structure. When the dielectric layer 116 is defined to form the bit line contact opening 118 and a misalignment happens, the position of the bit line contact opening 118 covers a portion of the gate structure. The dielectric layer 116 and the buffer oxide layer 112 are made from the same material, silicon oxide. Thus, the buffer oxide layer 112 is etched while etching the dielectric layer 116 to form the bit line contact opening 118. The polysilicon layer 106a is exposed after the buffer oxide layer being etched. As the bit line 120 fills in the contact opening 118, the conductive layer comes in contact with the exposed polysilicon layer 106a. A short between the gate structure and the bit line 120 is thus formed.

Another disadvantage is that the node contact opening 124 is formed through the dielectric layers 122 and 116. The aspect ratio of the node contact opening 124 is too large. Thus, the etching process for forming the contact opening 124 is difficult to perform and the conductive material used to form the lower electrode 126 also fills the node contact opening 124 with difficulty.

SUMMARY OF THE INVENTION

The invention provides a method for forming a stacked capacitor. A substrate is provided and is defined to form a memory cell region and a peripheral region. Isolation structures are formed on the substrate. A gate oxide layer and a polysilicon layer are formed over the substrate. The polysilicon layer and the gate oxide layer are defined to form a first gate on the memory cell region and to form a second gate on the peripheral region. Ion implantation is performed to form first doped regions in the substrate beside the first and second gates. Spacers are formed on the sidewalls of the first and second gates. A first dielectric layer is formed over the gates and the substrate. A node contact opening and a bit line contact opening are formed within the first dielectric layer to expose the substrate. The bit line contact opening further separates the first gate into two portions. Second doped regions are formed in the substrate exposed by the openings. Spacers are formed on the sidewalls of the openings. Conductive material is formed in the openings to form a bit line and a node landing pad. A second dielectric layer having an opening exposing the landing pad is formed over the first dielectric layer. Conductive material is formed to fill the opening in the second dielectric layer, thereby to form a lower electrode.

The bit line opening is formed by etching the first dielectric layer and the first gate. The opening is then filled with the conductive material. The opening has a spacer on its sidewall, so that the conductive material does not make contact with the polysilicon layer of the gate. Furthermore, the landing pad is formed while forming the bit line. The landing pad is a part of the lower electrode. After forming the second dielectric layer, a via opening is formed within the second dielectric layer to expose the landing pad. The aspect ratio of the via opening is smaller than a conventional node contact opening. Thus, the etching process for forming the via opening is easily performed. The step of forming conductive material in the via opening is also easily performed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 2A–2G are schematic, cross-sectional views showing the process steps of one preferred embodiment of the method for forming a stacked capacitor.

Figure 1A:
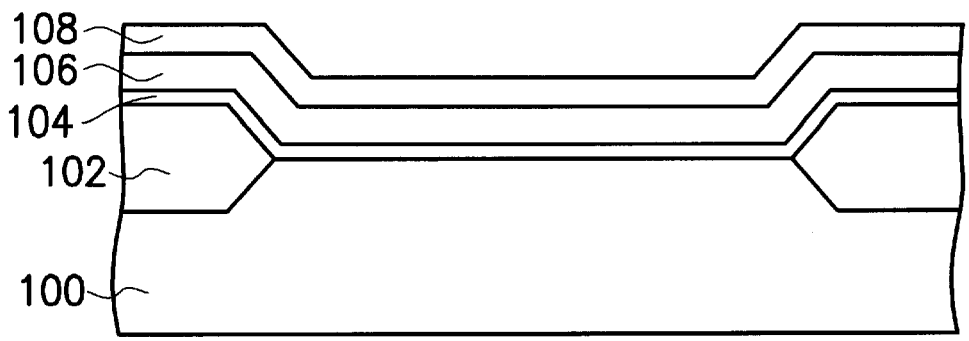
FIGS. 1A–1E are schematic, cross-sectional views showing a conventional method for forming the lower electrode.
Figure 1B:
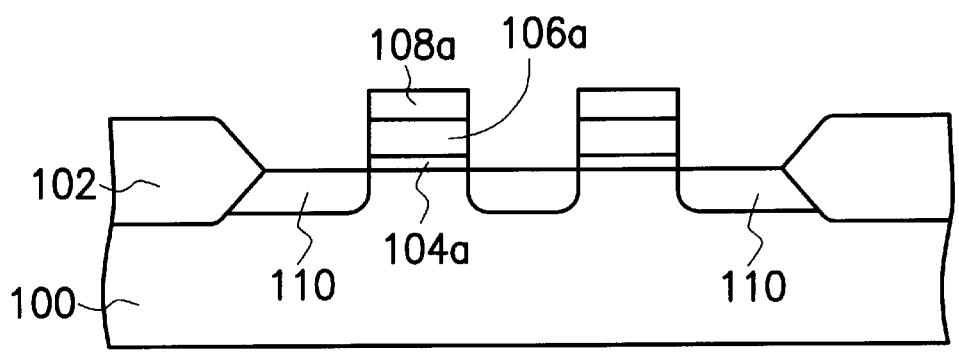
Figure 1C:
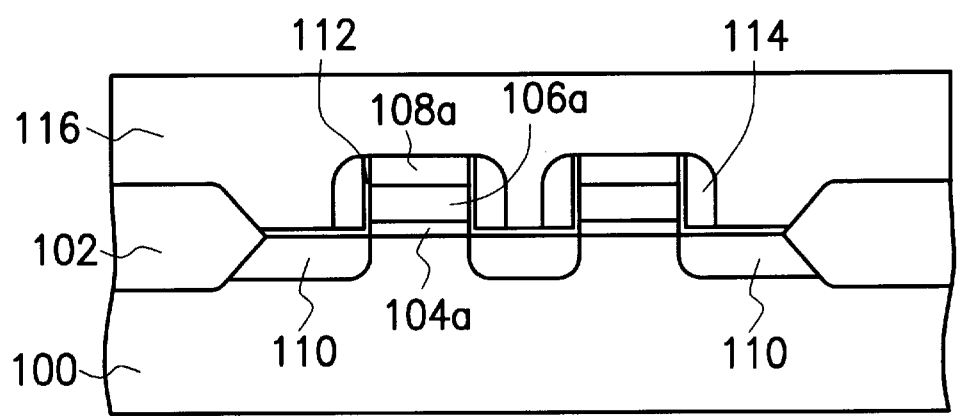
Figure 1D:
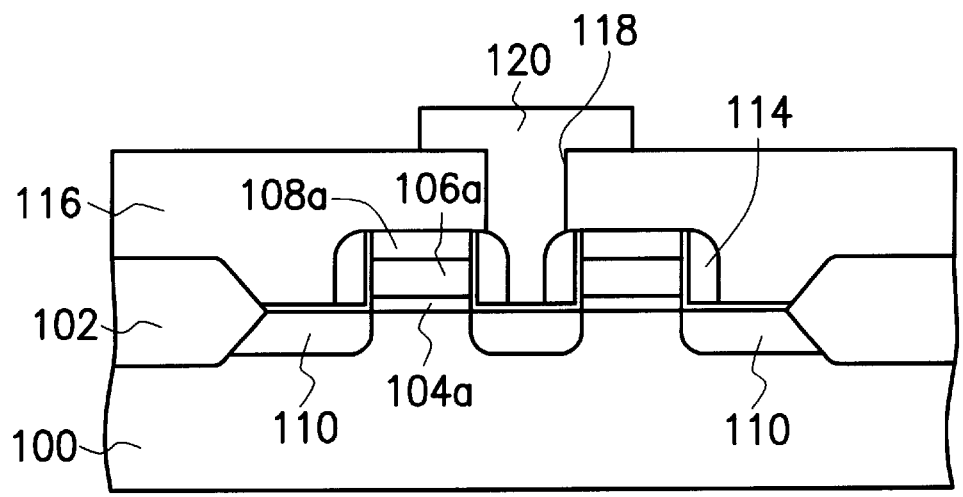
Figure 1E:
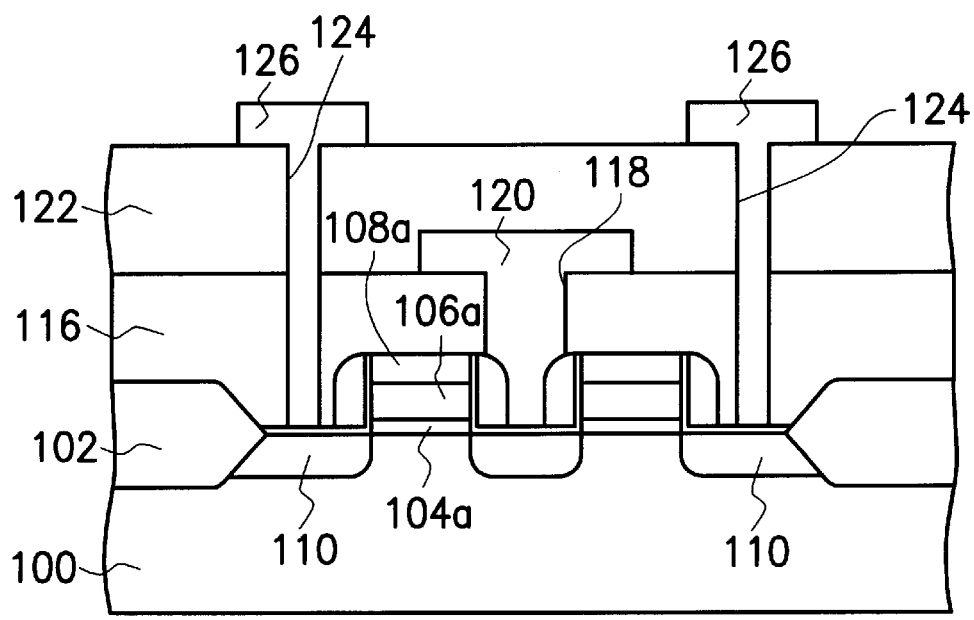
Figure 2A:
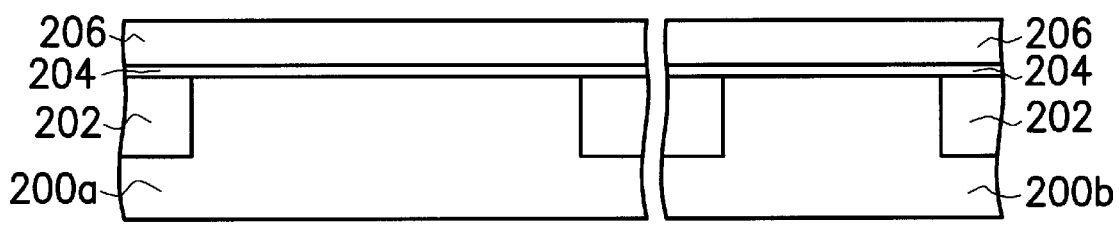
FIGS. 2A–2G are schematic, cross-sectional views showing the process steps of one preferred embodiment of the method for forming a stacked capacitor.

Referring to FIG. 2A, a substrate comprising a memory cell region 200a and a peripheral region 200b is provided. The substrate has a first conductive type, such as N-type or P-type. Isolation structures 202 are formed on the substrate. The isolation structures shown in FIG. 2A are shallow trench isolations. However, field oxide layers can be used as the isolation structures 202. A gate oxide layer 204 is formed over the whole substrate. A polysilicon layer 206 is formed on the gate oxide layer 204. The gate oxide layer 204 is formed, for example, by thermal oxidation. The polysilicon layer 206 may be formed by chemical vapor deposition (CVD), for example.

Figure 2B:
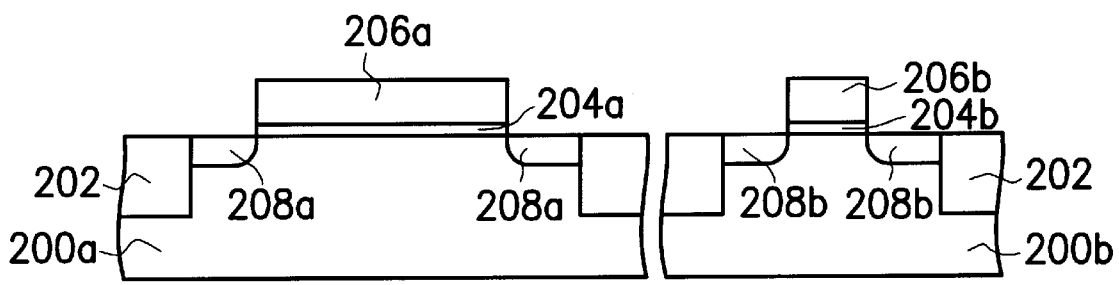

Referring to FIG. 2B, a first photolithography and etching process is performed to define the polysilicon layer 206 and the gate oxide layer 204. A first gate 206a and a first gate oxide layer 204a are thus formed in the memory cell region 200a, and a second gate 206b and a second gate oxide 204b are formed in the peripheral region 200b. Doped regions 208a and 208b are formed in the substrate while using the first gate 206a and the second gate 206b as a mask. The doped regions 208a and 208b have a second conductive type. The second conductive type and the first conductive type are opposite.

Figure 2C:
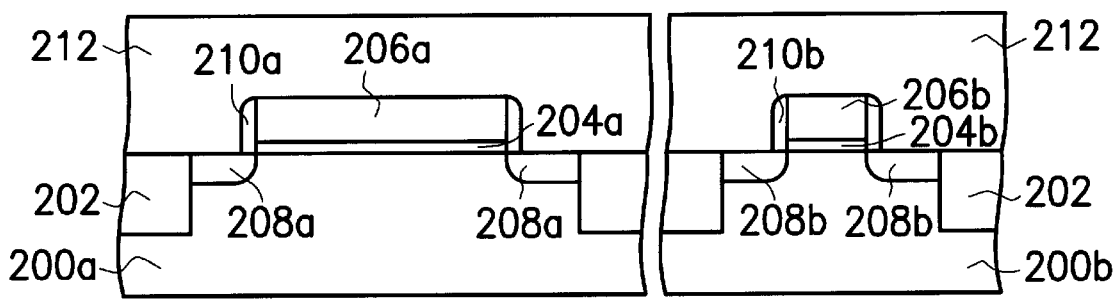

Referring to FIG. 2C, a spacer 210a is formed on the sidewall of the first gate 206a and a spacer 210b is formed on the sidewall of the second gate 206b. A dielectric layer 212, such as a doped silicon oxide layer, is formed over the structure described above. The doped silicon oxide layer may be a phosphosilicate glass (PSG) layer.

Figure 2D:
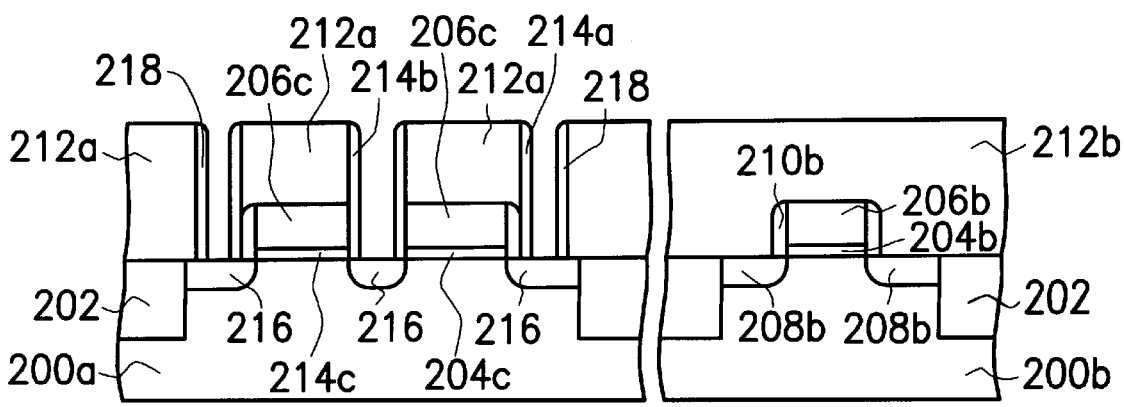

Referring to FIG. 2D, a photolithography and etching process is performed on the memory cell region 200a to form an opening 214a in the dielectric layer 212a. The opening 214a is a node contact opening exposing one of the doped regions 208a (FIG. 2C). Another opening 214b is formed within the first gate 206a to separate the first gate 206a into two portions, third and fourth gates 206c. A gate oxide layer 204c lies beneath the third and fourth gates 206c. The opening 214b is a bit line contact opening exposing the substrate between the third and fourth gates 206c.

Ion implantation is performed to form doped regions 216 in the substrate exposing by the openings 214a, 214b while using the dielectric layer 212a as a mask. The doped regions 216 have the second conductive type. Spacers 218 are then formed on the sidewall of the node contact opening 214a and on the sidewall of the bit line contact opening 214b. A material of the spacers 218 is silicon oxide.

Figure 2E:
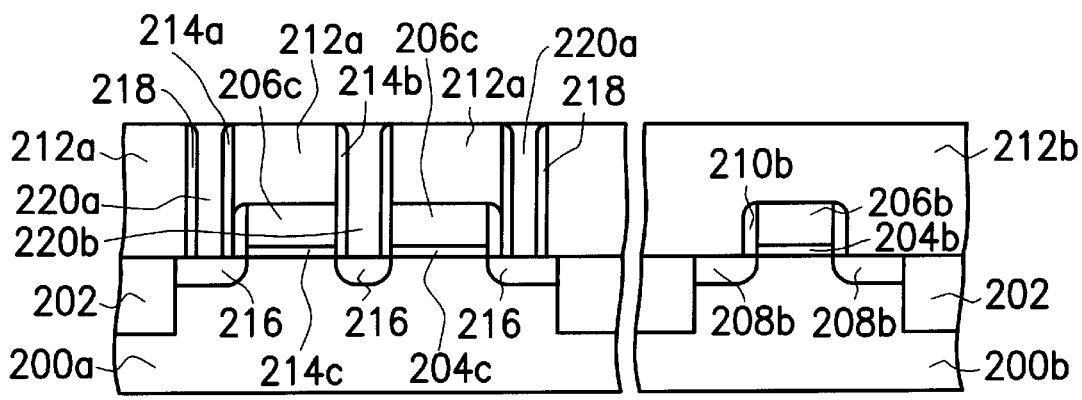

Referring to FIG. 2E, conductive material is formed to fill the node contact opening 214a and the bit line contact opening 214b so as to further form a node landing pad 220a and a bit line 220b. The conductive material is formed by CVD so that the conductive material is deposited on the dielectric layer 212a and within the openings 214a, 214b at the same time. A portion of the conductive material must be removed to separate the bit line 220b and the node landing pad 220a as shown in the figure. The conductive material outside the openings 214a, 214b can be removed by chemical mechanical polishing (CMP) while using the dielectric layer 212a as a end point. The conductive material outside the openings 214a, 214b also can be removed by a photolithography and etching process.

Figure 2F:
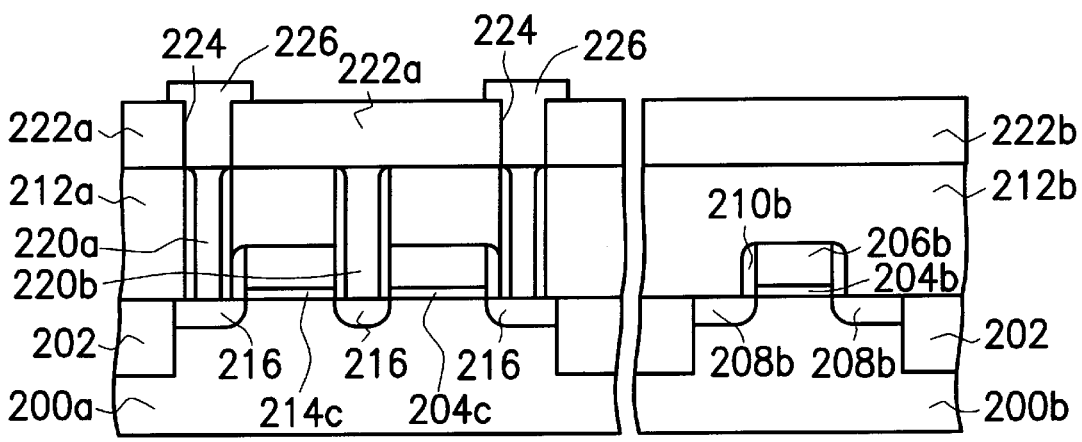
Figure 2G:
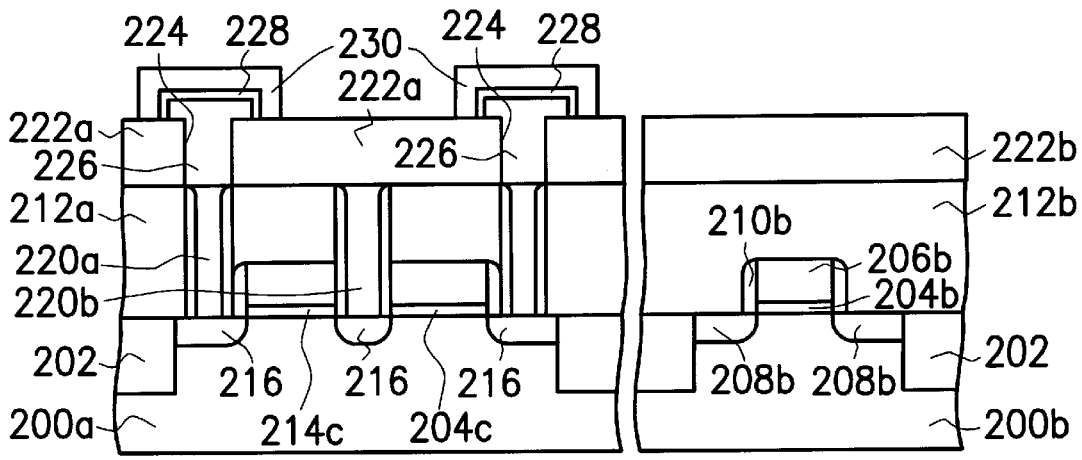

Referring to FIG. 2F, a planarized dielectric layer 222a, 222b, such as a doped silicon oxide layer, is formed on the structure shown in FIG. 2E. The doped silicon oxide layer may be a phosphosilicate glass (PSG) layer. A part of the dielectric layer 222a is removed to form a via opening 224 exposing the node landing pad 220a. A conductive layer 226 is formed within the via opening 224. A lower electrode comprising the conductive layer 226 and the node landing pad 220a is thus formed. The conductive layer 226 is formed by CVD so that a photolithography and etching process is required in order to remove unwanted conductive material. After forming the lower electrode, a dielectric film 228, such as an ONO film, is formed on the conductive layer 226 of the lower electrode. An upper electrode 230 is formed on the dielectric film 228. A capacitor structure is thus formed.

No silicon nitride is used while forming the capacitor of the invention so that stress from silicon nitride can be avoided. The bit line contact opening is formed by defining the first gate. The bit line is formed while filling conductive material into the bit line opening. There is a spacer between the defined gate and the conductive material so that the bit line does not contact the polysilicon layer of the gate.

Furthermore, the lower electrode comprises the node landing pad within the lower dielectric layer and the conductive layer within the upper dielectric layer. No opening with a high aspect ratio is formed in the invention. The processes for forming a via opening within the upper dielectric layer and for forming the node landing pad are easily performed.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a stacked capacitor, comprising the steps of:

providing a substrate divided into a memory cell region and a peripheral circuit region, wherein both the memory cell region and the peripheral circuit region have an isolation structure therein;

forming a gate oxide layer over the substrate;

forming a polysilicon layer on the gate oxide layer;

removing a part of the polysilicon layer and a part of the gate oxide layer to form a first gate in the memory cell region and to form a second gate in the peripheral circuit region;

forming first doped regions in the substrate beside the first gate and the second gate;

respectively forming a first spacer on each sidewall of the first gate and of the second gate;

forming a first dielectric layer over the substrate;

defining the first dielectric layer to form a node contact opening and a bit line contact opening therein exposing the substrate, wherein the bit line contact opening is located between the first gate and further breaks the first gate to a third gate and a fourth gate;

forming second doped regions in the exposed substrate;

respectively forming a second spacer on the sidewall of the bit line contact opening and the node contact opening;

forming a first conductive material to fill the node contact opening and the bit line contact opening, wherein the first conductive material in the node contact opening serves as a node landing pad and the first conductive material in the bit line contact opening serves as a bit line;

forming a second dielectric layer on the bit line, the node landing pad and the first dielectric layer;

defining the second dielectric layer to form a via opening exposing the node landing pad;

forming a second conductive layer on the second dielectric layer and in the via opening;

removing a part of the second conductive layer, wherein the remaining second conductive layer and the node landing pad together compose a lower electrode;

forming a dielectric film on the lower electrode; and forming an upper electrode on the dielectric film.

2. The method according to claim 1, wherein the first spacer and the second spacer comprise silicon oxide.

3. The method according to claim 2, wherein the first dielectric and the second dielectric layers comprise doped silicon oxide.

4. The method according to claim 3, wherein the first and the second dielectric layers comprise phosphosilicate glass (PSG).

5. The method according to claim 1, wherein the substrate has a first conductive type, and the first and second doped regions both have a second conductive type, wherein the first conductive type and the second conductive type are opposite.

6. The method according to claim 1, wherein forming the node landing pad and the bit line further comprises the steps of:

forming the first conductive material on the first dielectric layer, in the node contact opening and in the bit line contact opening; and removing a part of the first conductive material to separate a first conductive material filling the node contact opening and a conductive material filling the bit line contact opening from each other.

7. The method according to claim 6, wherein the step of removing a part of the first conductive material is performed by chemical mechanical polishing (CMP) until exposing a top surface of the first dielectric layer.

8. The method according to claim 6, wherein the step of removing a part of the first conductive material is performed by a photolithography and etching process to remove a part of the first conductive material between the bit line contact opening and the node contact opening.

9. A method for forming a lower electrode of a capacitor, comprising the steps of:

providing a substrate;

forming a gate on the substrate;

forming a first dielectric layer on the gate and on the substrate;

forming first doped regions in the substrate beside the gate;

defining the first dielectric layer to form a first opening exposing a part of the substrate, which part is uncovered by the gate, and to form a second opening through the gate exposing a part of the substrate under the gate;

forming second doped regions in the exposed substrate;

forming spacers on each sidewall of the first and the second openings;

forming a landing pad in the first opening and a bit line in the second opening;

forming a second dielectric layer over the first dielectric layer;

defining the second dielectric layer to expose the landing pad; and forming a conductive layer on the second dielectric layer to electrically connect to the landing pad.

10. The method according to claim 9, wherein a material of the spacers is silicon oxide.

11. The method according to claim 10, wherein a material of the first and second dielectric layers comprises doped silicon oxide.

12. The method according to claim 11, wherein the material of the first and second dielectric layers is phosphosilicate glass (PSG).

13. The method according to claim 9, wherein the substrate has a first conductive type, and the first and second doped regions both have a second conductive type, wherein the first conductive type and the second conductive type are opposite.

* * * * *